(12) United States Patent
Jang et al.

(10) Patent No.: US 11,126,028 B2
(45) Date of Patent: *Sep. 21, 2021

(54) PHOTOLUMINESCENT LIQUID CRYSTAL DISPLAY

(71) Applicant: SAMSUNG ELECTRONICS CO., LTD., Suwon-si (KR)

(72) Inventors: Eun Joo Jang, Suwon-si (KR); Shin Ae Jun, Seongnam-si (KR); Hyun A Kang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 286 days.

This patent is subject to a terminal disclaimer.

(21) Appl. No.: 15/692,906

(22) Filed: Aug. 31, 2017

(65) Prior Publication Data

US 2017/0363908 A1  Dec. 21, 2017

Related U.S. Application Data

(63) Continuation of application No. 14/822,114, filed on Aug. 10, 2015, now Pat. No. 9,753,324.

(30) Foreign Application Priority Data

Sep. 4, 2014  (KR) .................. 10-2014-0117939

(51) Int. Cl.
*G02F 1/1335* (2006.01)
*G02F 1/13357* (2006.01)
(Continued)

(52) U.S. Cl.
CPC ...... *G02F 1/133514* (2013.01); *G02F 1/1336* (2013.01); *G02F 1/133528* (2013.01);
(Continued)

(58) Field of Classification Search
CPC ......... G02F 1/133514; G02F 1/133617; G02F 1/1336; G02F 1/133528; G02F 2201/086;
(Continued)

(56) References Cited

U.S. PATENT DOCUMENTS 6,867,379 B2  3/2005  Hayashi
7,649,584 B2  1/2010  Lee
(Continued)

FOREIGN PATENT DOCUMENTS

JP  2013200953 A  10/2013
KR  1020070094679  9/2007
(Continued)

OTHER PUBLICATIONS

Amit Sitt, et al., "Band-gap engineering, optoelectronic properties and applications of colloidal heterostructured semiconductor nanorods", Nano Today, (2013), vol. 8, pp. 494-513.
(Continued)

*Primary Examiner* — Eli D. Strah
(74) *Attorney, Agent, or Firm* — Cantor Colburn LLP

(57) ABSTRACT

A photoluminescent liquid crystal display includes: a liquid crystal panel including a lower substrate, an upper substrate, a liquid crystal layer interposed between the upper and lower substrates, and a photoluminescent color filter layer disposed between the upper substrate and the liquid crystal layer; an optical device disposed on the upper substrate; a polarizing plate disposed under the lower substrate; and a backlight unit disposed under the polarizing plate and which emits blue light, where the photoluminescent color filter layer includes a first color filter which emits polarized red light, a second color filter which emits polarized green light, and a third color filter which emits polarized blue light, and the first color filter and the second color filter include a semiconductor nanocrystal-polymer composite.

15 Claims, 6 Drawing Sheets

(51) Int. Cl.
*G02B 5/30* (2006.01)
*H01L 29/12* (2006.01)
*H01L 29/66* (2006.01)
*H01L 31/0352* (2006.01)

(52) U.S. Cl.
CPC .... *G02F 1/133617* (2013.01); *B32B 2457/20* (2013.01); *B32B 2457/202* (2013.01); *B32B 2457/206* (2013.01); *C09K 2323/03* (2020.08); *C09K 2323/031* (2020.08); *C09K 2323/06* (2020.08); *G02B 5/30* (2013.01); *G02B 5/3025* (2013.01); *G02F 1/133614* (2021.01); *G02F 2201/086* (2013.01); *H01L 29/125* (2013.01); *H01L 29/66977* (2013.01); *H01L 31/035209* (2013.01); *H01L 31/035218* (2013.01); *H01L 31/035227* (2013.01)

(58) Field of Classification Search
CPC ... G02F 2001/133614; G02F 1/133614; Y10T 428/1036; Y10T 428/1086; Y10T 428/1041; B32B 2457/20; B32B 2457/202; B32B 2457/206; C09K 2323/03; C09K 2323/031; C09K 2323/06; G02B 5/30; G02B 5/3025; H01L 29/125; H01L 29/66977; H01L 31/035209; H01L 31/035218; H01L 31/035227
See application file for complete search history.

(56) References Cited

U.S. PATENT DOCUMENTS

| | | | |
|---|---|---|---|
| 7,649,594 | B2 | 1/2010 | Kim et al. |
| 7,982,812 | B2 | 7/2011 | Rho et al. |
| 8,593,586 | B2 | 11/2013 | Wang et al. |
| 8,648,524 | B2 | 2/2014 | Weiss et al. |
| 9,753,324 | B2 * | 9/2017 | Jang .................. G02F 1/133514 |
| 2010/0167011 | A1 * | 7/2010 | Dubrow ................ C23C 16/403 |
| | | | 428/141 |
| 2011/0299011 | A1 | 12/2011 | Weiss et al. |
| 2012/0113672 | A1 * | 5/2012 | Dubrow ............... G02B 6/0055 |
| | | | 362/602 |
| 2012/0287381 | A1 * | 11/2012 | Li ..................... G02F 1/133617 |
| | | | 349/106 |
| 2013/0021560 | A1 | 1/2013 | Wang et al. |
| 2013/0135558 | A1 | 5/2013 | Kim et al. |
| 2013/0242228 | A1 * | 9/2013 | Park .................. G02F 1/133377 |
| | | | 349/61 |
| 2014/0009902 | A1 * | 1/2014 | Banin ............... G02F 1/133617 |
| | | | 362/19 |
| 2014/0042003 | A1 | 2/2014 | Meftah et al. |
| 2014/0254011 | A1 * | 9/2014 | McCarthy ........... G02B 5/3058 |
| | | | 359/485.05 |
| 2015/0331297 | A1 * | 11/2015 | Han ..................... G02B 5/3058 |
| | | | 359/9 |
| 2020/0224092 | A1 | 7/2020 | Dubrow |
| 2020/0249388 | A1 | 8/2020 | Dubrow et al. |

FOREIGN PATENT DOCUMENTS

| | | |
|---|---|---|
| KR | 1020070107498 A | 11/2007 |
| KR | 1020090036373 | 4/2009 |
| KR | 1020100089606 | 8/2010 |
| KR | 1020130059222 | 6/2013 |
| KR | 1020130104862 | 9/2013 |
| KR | 1020130120486 A | 11/2013 |
| KR | 1020140042274 | 4/2014 |
| WO | 2012035535 | 3/2012 |

OTHER PUBLICATIONS

Eue-Soon Jang, et al., "Soft-solution route to various ZnO nanoplate arrays†", CrystEngComm., Nov. 2010; vol. 12, No. 11, pp. 3467-3470.
Ido Hadar, et al., "Polarization Properties of Semiconductor Nanorod Heterostructures: From Single Particles to the Ensemble", J. Phys. Chem. Letters, 2013, vol. 4, pp. 502-507.
Korean Office Action for KR Application No. 10-2014-0117939 dated Jul. 9, 2020.

* cited by examiner

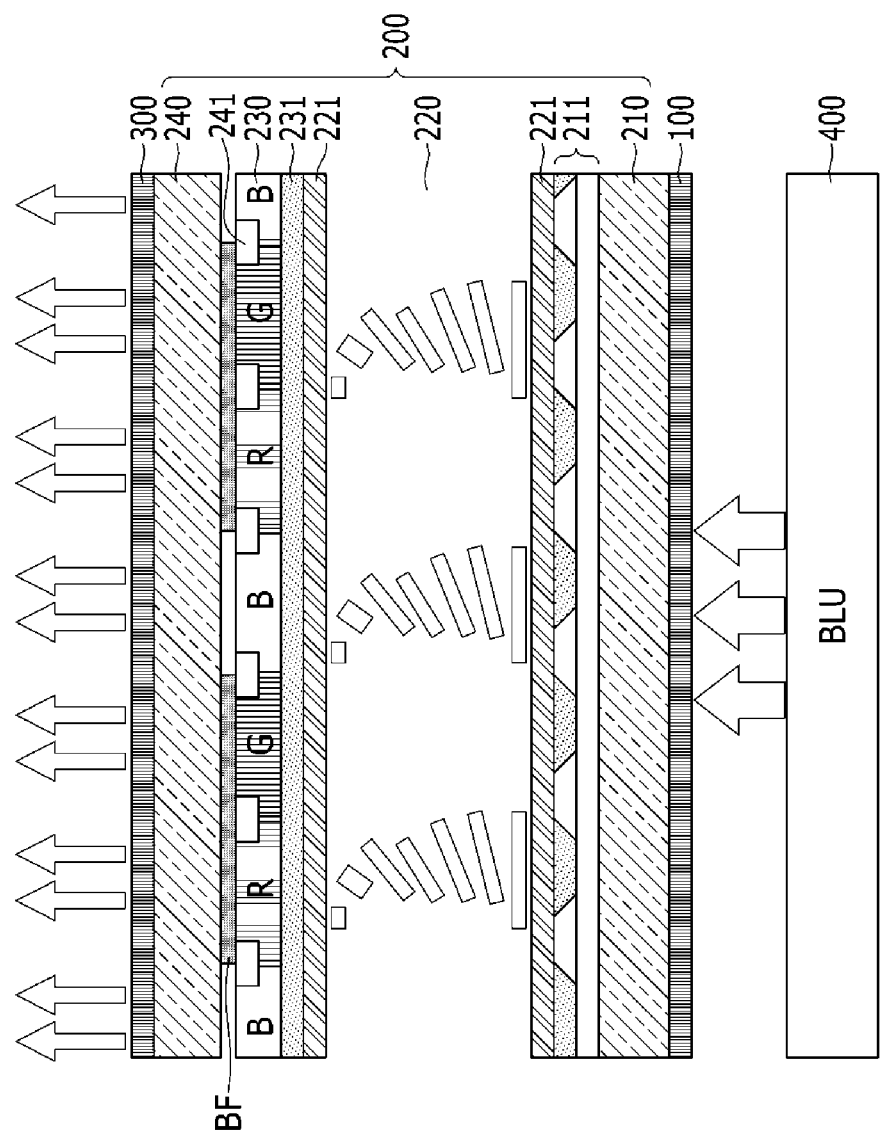

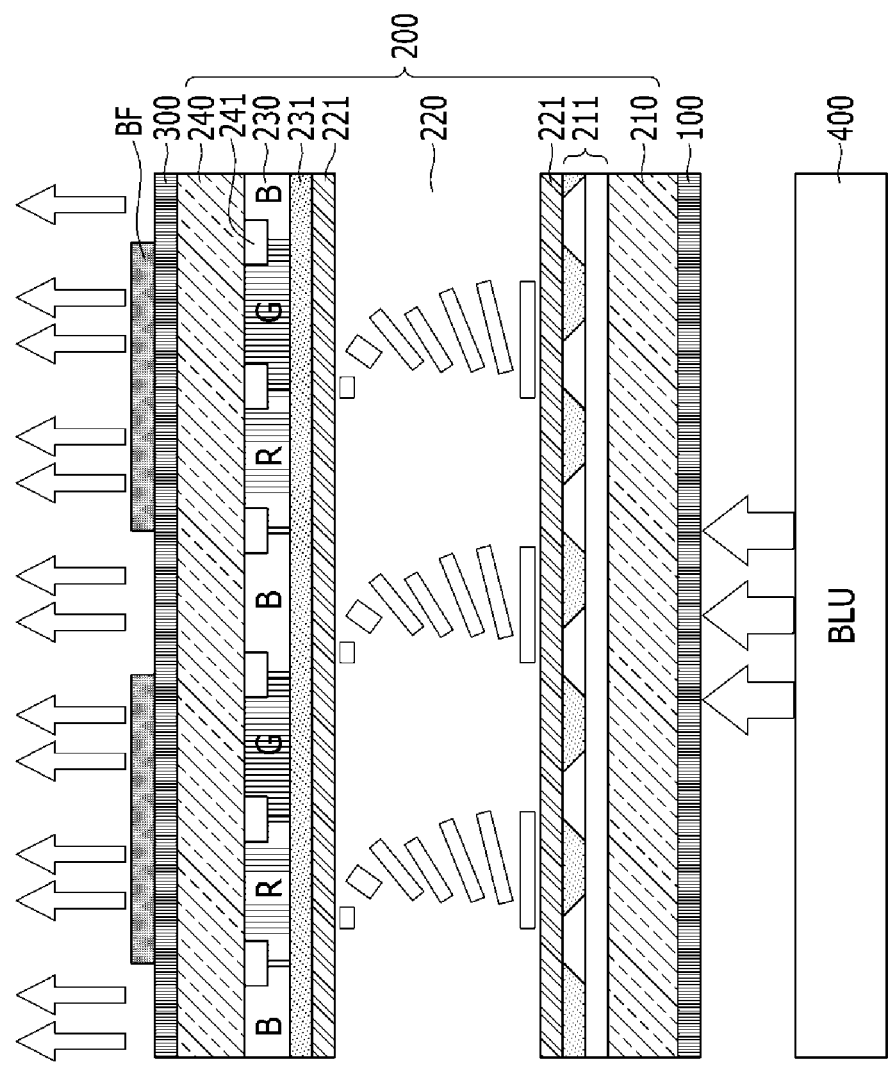

PHOTOLUMINESCENT LIQUID CRYSTAL DISPLAY

CROSS-REFERENCE TO RELATED APPLICATIONS

This application is a continuation of U.S. patent application Ser. No. 14/822,114, filed on Aug. 10, 2015, which claims priority to Korean Patent Application No. 10-2014-0117939 filed on Sep. 4, 2014, and all the benefits accruing therefrom under 35 U.S.C. § 119, the content of which in its entirety is herein incorporated by reference.

BACKGROUND

1. Field

Embodiments of the invention relate to a photoluminescent liquid crystal display ("LCD").

2. Description of the Related Art

A liquid crystal display ("LCD"), which is one of most widely used types of flat panel display, typically includes two substrates (e.g., a lower substrate and an upper substrate) in which a pixel electrode and a common electrode or the like are provided, and a liquid crystal layer interposed therebetween. The lower (array) substrate may have a plurality of gate wires and data wires on the top surface, and include a thin film transistor at a crossing point of the gate and date wires to be connected with a pixel electrode of each pixel area. The upper substrate may include a color filter layer including a patterned absorptive color filter (e.g., red, green and blue filters) corresponding to the pixel area. A first polarizing plate may be provided on an external surface (e.g., a bottom surface) of the lower substrate, and a second polarizing plate may be provided on an external surface (e.g., a top surface) of the upper substrate.

SUMMARY

In a conventional liquid crystal display having a structure described above, at least a half of light transmitted through the first polarizing plate may be absorbed by a color filter such that a light extraction rate may be substantially decreased.

Embodiments of the invention provide a liquid crystal display having an improved light extraction rate.

In an embodiment, a photoluminescent liquid crystal display includes: a liquid crystal panel including a lower substrate, an upper substrate disposed opposite to the lower substrate, a liquid crystal layer interposed between the upper and lower substrates, and a photoluminescent color filter layer disposed between the upper substrate and the liquid crystal layer; a polarizing plate disposed under the lower substrate; and a backlight unit disposed under the polarizing plate and which emits blue light. In such an embodiment, the photoluminescent color filter layer includes a first color filter which emits polarized red light, a second color filter which emits polarized green light, and a third color filter which emits polarized blue light, and the first color filter and the second color filter include a semiconductor nanocrystal-polymer composite.

In an embodiment, the photoluminescent liquid crystal display may further include an optical device disposed on the upper substrate.

In an embodiment, the optical device may maintain polarization of light emitted from the photoluminescent color filter layer. In such an embodiment, the optical device may include a polarizer or a refractive index-controlling coating having no polarization function.

In an embodiment, the semiconductor nanocrystal-polymer composite of the first color filter may include a plurality of aligned quantum rods, an array composite, or a plurality of aligned quantum plates, where the array composite includes a plurality of isotropic semiconductor nanocrystals and a plurality of longitudinally aligned metal nanowires. In such an embodiment, the quantum rods, the isotropic semiconductor nanocrystal or the quantum plates in the first color filter may emit red light.

In an embodiment, the semiconductor nanocrystal-polymer composite of the second color filter may include a plurality of aligned quantum rods, an array composite or a plurality of aligned quantum plates, where the array composite includes a plurality of isotropic semiconductor nanocrystals and a plurality of longitudinally aligned nanowires. In such an embodiment, the quantum rods, the isotropic semiconductor nanocrystals or the quantum plates in the second color filter may emit green light.

In an embodiment, the quantum rods of the semiconductor nanocrystal-polymer composite of the first or second color filter may have an aspect ratio of greater than or equal to about 5.

In an embodiment, the metal nanowire of the semiconductor nanocrystal-polymer composite of the first or second color filter may include a metal capable of showing a surface plasmon coupling.

In an embodiment, the metal capable of showing the surface plasmon coupling may include gold, silver, copper, platinum, nickel, or a combination thereof.

In an embodiment, the metal nanowire of the semiconductor nanocrystal-polymer composite of the first or second color filter may have a diameter of less than or equal to about 200 nm and an aspect ratio of greater than or equal to about 10.

In an embodiment, the semiconductor nanocrystal-polymer composite of the array composite may have a multi-layered structure including a first layer including an array of the longitudinally aligned metal nanowires dispersed in a host matrix, and a second layer in contact with a surface of the first layer and including the isotropic semiconductor nanocrystals dispersed in a host matrix.

In an embodiment, the array composite including the plurality of isotropic semiconductor nanocrystals and the plurality of longitudinally aligned nanowires may have a monolayer structure including an array of the longitudinally aligned metal nanowires and the isotropic semiconductor nanocrystals in a host matrix.

In an embodiment, the host matrix of the first layer and the host matrix of the second layer may be the same as or different from each other, and may include a transparent polymer.

In an embodiment, the third color filter may include a transparent color filter which does not change a light spectrum of light incident thereto.

In an embodiment, the third color filter may further include a plurality of aligned quantum rods.

In an embodiment, the third color filter may further include a scatterer capable of maintaining polarization of incident light.

In an embodiment, the photoluminescent liquid crystal display may further include a blue light blocking layer disposed on the first color filter and the second color filter.

In an embodiment, a semiconductor nanocrystal of the semiconductor nanocrystal-polymer composite may have a core-shell structure.

In an embodiment, a semiconductor nanocrystal of the semiconductor nanocrystal-polymer composite may include a Group II-VI compound, a Group III-V compound, a Group IV-VI compound, a Group IV compound, or a combination thereof.

BRIEF DESCRIPTION OF THE DRAWINGS

The above and other features of the invention will become more apparent by describing in detailed exemplary embodiments thereof with reference to the accompanying drawings, in which:

FIG. 5 is a cross-sectional view of an alternative embodiment of an LCD according to the invention; and FIG. 6 is a cross-sectional view of another alternative embodiment of an LCD according to the invention.

DETAILED DESCRIPTION

Figure 1:
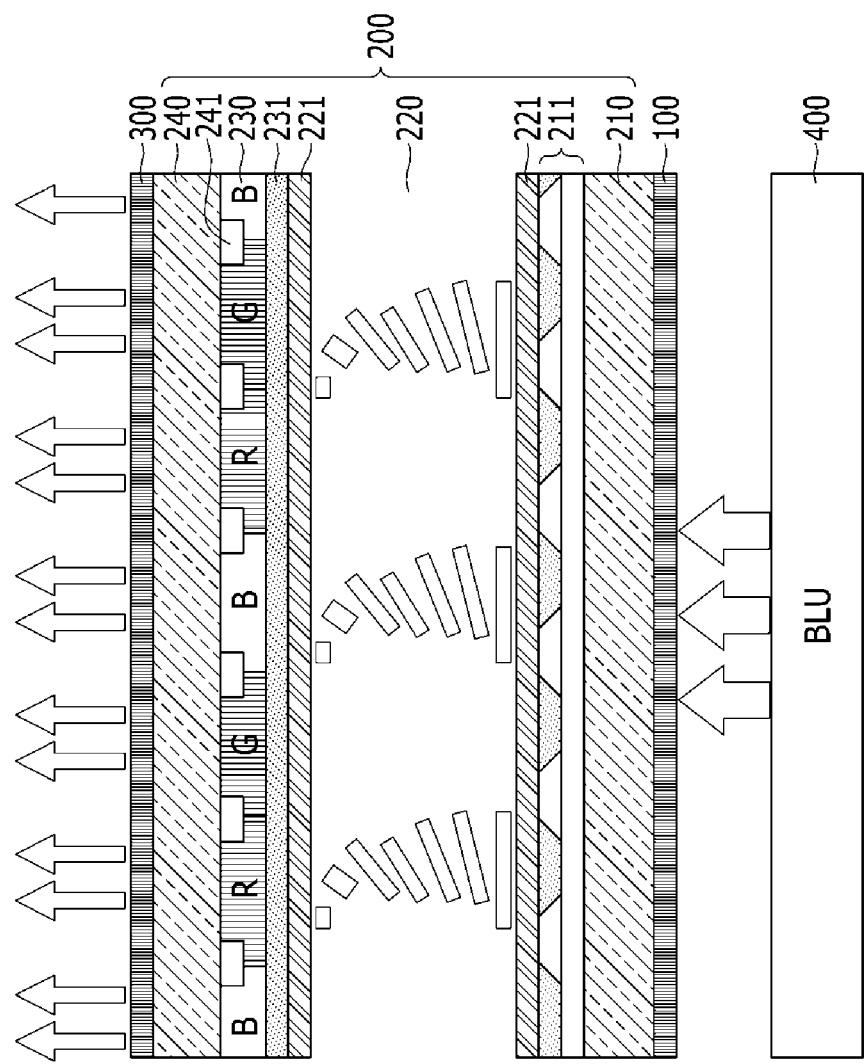
FIG. 1 is a cross-sectional view of an embodiment of a liquid crystal display ("LCD") according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations.

Herein, the term "longitudinally aligned" refers to the longitudinal axis of a plurality of metal nanowires (e.g., an axis perpendicular to the cross-sectional surface) being arranged substantially parallel to the alignment direction. For example, the term "a plurality of longitudinally aligned metal nanowires" means that multiple nanowires may not meet each other through the entire length of the wires. In the specification, the term "linearly polarized" means that the electronic field component of electromagnetic waves (light) is confined to oscillate in a single plane perpendicular to the progressing direction. An aspect ratio in the specification refers to a value found by dividing the longitudinal length by the diameter thereof (length/diameter).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in detail with reference to the accompanying drawings.

FIG. 1 is a cross-sectional view of an embodiment of a liquid crystal display ("LCD") according to the invention. Referring to FIG. 1, an embodiment of a photoluminescent LCD includes a liquid crystal panel 200, an optical device 300 disposed on the liquid crystal panel 200, a polarizing plate 100 under the liquid crystal panel 200, and a backlight unit (BLU in FIG. 1) 400 including a blue light source and disposed under the polarizing plate 100.

The liquid crystal panel 200 includes a lower substrate 210, an upper substrate 240, a liquid crystal layer 220 interposed between the upper and lower substrates, and a photoluminescent color filter layer 230 disposed on the upper substrate 240.

The lower substrate 210 (also referred to be as an array substrate) may be a transparent insulation material substrate (e.g., a glass substrate, a polymer substrate including a polyester such as polyethylene terephthalate ("PET") and polyethylene naphthalate ("PEN"), a polycarbonate, and/or a polyacrylate, or an inorganic material substrate of polysiloxane, Al$_2$O$_3$, ZnO, and the like). A wire plate 211 is disposed on an internal surface, e.g., a top surface, of the lower substrate 210. The wire plate 211 may include a plurality of gate wires (not shown) and data wires (not shown), a thin film transistor disposed adjacent to a crossing region of gate wires and data wires, and a pixel electrode for each pixel area, but is not limited thereto. In one embodiment, for example, pixel areas may be defined by the gate and data wires. The wire plate may have any structure or feature well-known in the art, and are not particularly limited.

The liquid crystal layer 220 may be disposed on the wire plate 211. The liquid crystal layer 220 may include alignment layers 221 on and under the layer 220 to initially align the liquid crystal material included therein. The liquid crystal material and the alignment layer may have any structure or feature well-known in the art (e.g., liquid crystal material, alignment layer material, method of forming liquid crystal layer, thickness of liquid crystal layer, or the like) and are not particularly limited.

The polarizing plate 100 is disposed on an external surface of the lower substrate 210, e.g., under the lower substrate 210. The material and structure of the polarizing plate 100 may be any material or structure well-known in the art, and are not particularly limited. The backlight unit 400 that emits blue light is disposed under the polarizing plate 100.

The backlight unit includes a light source that emits the blue light. According to an embodiment, the backlight unit may be an edge-type backlight unit. In one embodiment, for example, the backlight unit may include a reflector (not shown), a light guide (not shown) disposed on the reflector and which guide the light from the light source to the liquid crystal panel 200, and/or one or more optical sheets (not shown) such as a diffusion plate, a prism sheet, or the like disposed on the light guide, but is not limited thereto.

In an alternative embodiment, the backlight unit 400 may be a direct lighting type of backlight unit. In one embodiment, for example, the backlight unit may have a reflector (not shown) and a plurality of fluorescent lamps disposed on the reflector with a predetermined interval therebetween; or may have a light emitting diode ("LED")-driving substrate including a plurality of LEDs and a diffusion plate, and selectively, one or more optical sheets thereon.

The backlight unit have any structure well-known in the art (e.g., features of each member such as light guide and optical sheet, reflector, or the like), and are not particularly limited.

The upper substrate 240 (also referred to be as a color filter substrate) may be a transparent insulation material substrate (e.g., a glass substrate, a polymer substrate including a polyester such as PET and PEN, a polycarbonate, and/or a polyacrylate, or an inorganic material substrate of polysiloxane, Al$_2$O$_3$, ZnO, and the like). The optical device 300 may be disposed on the upper substrate 240. The optical device 300 may be a member for maintaining polarization of light emitted from the photoluminescent color filter layer. In one embodiment, for example, the optical device 300 may be a polarizer. The polarizer may include triacetyl cellulose ("TAO"), having a thin thickness of less than or equal to about 200 µm, but is not limited thereto. In an alternative embodiment, the optical device may be a refractive index-controlling coating without a polarization function.

A black matrix 241 having an opening defined therethrough is disposed on the upper substrate 240, e.g., the bottom surface of the upper substrate 240, to cover a gate line, a data line, a thin film transistor, or the like of the wire plate disposed on the lower substrate 210. In one exemplary embodiment, for example, the black matrix 241 may have a lattice shape. A photoluminescent color filter layer 230 including a first color filter (R) for emitting polarized red light, a second color filter (G) for emitting polarized green light, and a third color filter (B) for emitting polarized blue light is disposed on the black matrix 241 and in the opening of the black matrix 241. In an embodiment, the photoluminescent color filter layer may further include a fourth color filter for emitting other colors (for example, cyan, magenta and yellow) different from the colors of the polarized red, green and blue light. The color filter such as the first color filter, the second color filter, the third color filter, and the like of the photoluminescent color filter layer 230 may be sequentially or repeatedly arranged in positions corresponding to the pixel areas defined on the lower substrate. A transparent common electrode 231 may be disposed on the photoluminescent color filter layer.

In an embodiment, the first color filter and the second color filter include a semiconductor nanocrystal-polymer composite. In an embodiment, the third color filter may include a semiconductor nanocrystal-polymer composite. Herein, the term "semiconductor nanocrystal" is a general term including a quantum rod, an isotropic semiconductor nanocrystal (i.e., quantum dot), and a sheet-type semiconductor. In an embodiment, the semiconductor nanocrystal-polymer composite maybe patterned to have a patterned structure. In such an embodiment, the patterning method for providing the patterned structure of the semiconductor nanocrystal-polymer composite is not particularly limited. In one embodiment, for example, a semiconductor nanocrystal-polymer solution may be patterned according to an Inkjet or screen printing method to provide a patterned semiconductor nanocrystal-polymer composite, but the method is not limited thereto.

An LCD including an absorptive color filter generally has low light transmittance of about 5 to about 10 based on a light amount emitted from the backlight. An LCD employing a photoluminescent color filter has been suggested to improve light transmittance thereof. However, in such a photoluminescent LCD, a color filter is typically disposed on all of the polarizing plates therein so that the polarization of polarized light passed through the liquid crystal is maintained when passing through the photoluminescent color filter (including quantum dots, phosphor, or the like). In such a photoluminescent LCD, the photoluminescent color filter is disposed outside of the liquid crystal panel.

In an embodiment of an LCD according to the invention, the first, second and third color filters R, G and B of the color filter layer 230 may emit polarized light in a predetermined or desirable direction based on light passed through the liquid crystal layer 220. Accordingly, in such an embodiment, the color filter layer defined by the first to third color filters R, G and B may be disposed in the liquid crystal panel 200, then the optical element, for example, a polarizer or a refractive index coating having no polarizing performance, may be provided on the color filter layer. In such an embodiment, the polarizer is an optical element which does not change the polarization direction of light emitted from the color filter.

In an embodiment of the invention, where a photoluminescent color filter layer is disposed in the liquid crystal panel, the polarizing plate is provided on the top surface of upper substrate, a photoluminescent LCD may be fabricated effectively on the liquid crystal layer. In such an embodiment, the photoluminescent color filter layer 230 is disposed in the display panel 200 (e.g., under the upper substrate 241), and a polarizer or a refractive index-controlling coating is disposed on the display panel 200, such that the light emitting possibility of the color filter by extraneous light is effectively prevented or substantially low, such that the display quality is substantially improved (e.g., the contrast ratio is improved) compared to the conventional photoluminescent LCD where the color filter layer is disposed outside of the display panel.

In an embodiment, the first color filter (R) including the semiconductor nanocrystal-polymer composite may include a plurality of aligned quantum rods (e.g., anisotropic nanocrystals), an array composite of a plurality of isotropic semiconductor nanocrystals and a plurality of metal nanowires which are longitudinally aligned, or a plurality of aligned quantum plates (e.g., aligned plate-shaped semiconductor nanocrystals). The quantum rods, the isotropic semiconductor nanocrystals and the quantum plates included in the first color filter (R) may emit red light. The peak wavelength of the red light may be in a range from about 590 nanometers (nm) to about 700 nm, but is not limited thereto.

The second color filter (G) including a semiconductor nanocrystal-polymer composite may include an array composite including a plurality of aligned quantum rods, a plurality of isotropic semiconductor nanocrystals and a plurality of longitudinally aligned nanowires, or a plurality of aligned quantum plates. The quantum rods, the isotropic semiconductor nanocrystals or the quantum plates included in the second color filter (G) may emit green light. The green light emitted from the second color filter (G) may have a peak wavelength in a range from about 510 nm to about 570 nm, but is not limited thereto.

In such an embodiment, the semiconductor nanocrystal may control the light emitting wavelength by changing a size or a composition thereof. In one embodiment, for example, the semiconductor nanocrystal may include a Group II-VI compound, a Group III-V compound, a Group IV-VI compound, a Group IV compound, or a combination thereof. The Group II-VI compound may include at least one selected from a binary element compound selected from CdSe, CdTe, ZnS, ZnSe, ZnTe, ZnO, HgS, HgSe, HgTe, MgSe, MgS and a combination thereof; a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and a combination thereof; and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe and a combination thereof. The Group III-V compound semiconductor may include at least one selected from a binary element compound selected from GaN, GaP, GaAs, GaSb, AlN, AlP, AlAs, AlSb, InN, InP, InAs, InSb and a combination thereof; a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP and a combination thereof; and a quaternary element compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and a combination thereof. The Group IV-VI compound may include at least one selected from a binary element compound selected from SnS, SnSe, SnTe, PbS, PbSe, PbTe and a combination thereof; a ternary element compound selected from SnSeS, SnSeTe, SnSTe, PbSeS, PbSeTe, PbSTe, SnPbS, SnPbSe, SnPbTe and a combination thereof; and a quaternary element compound selected from SnPbSSe, SnPbSeTe, SnPbSTe and a combination thereof. The Group IV compound may include at least one selected from a singular element compound selected from Si, Ge and a combination thereof; and a binary element compound selected from SiC, SiGe and a combination thereof.

The binary element compound, the ternary element compound, or the quaternary element compound exists in a uniform concentration or in partially different concentrations in a same semiconductor nanocrystal particle. The semiconductor nanocrystal may have a core/shell structure in which a first semiconductor nanocrystal surrounds a second semiconductor nanocrystal. The elements in the shell may have a concentration gradient such that the concentration thereof becomes gradually lower from the shell to the core. In an embodiment, the semiconductor nanocrystal may have a structure including a semiconductor nanocrystal core and a multi-layer shell surrounding the semiconductor nanocrystal core. The multi-layer shell may have a structure including a two or more shell layers. Each layer of the multi-layer shell may include a single composition or an alloy, or may have a concentration gradient.

In an embodiment, the material composition for the shell has a higher energy band gap than energy band of the core such that the semiconductor nanocrystal may have a structure effectively showing the quantum confinement effect. In an embodiment where the semiconductor nanocrystal includes a multi-layered shell, the energy band gap of a shell disposed more distant from the core is higher than the energy band gap of a shell closer to the core.

In an embodiment, the semiconductor nanocrystal may have a quantum yield of greater than or equal to about 10%, for example, greater than or equal to about 30%, greater than or equal to about 50%, greater than or equal to about 60%, greater than or equal to about 70%, or greater than or equal to about 90%, but not being limited thereto.

In an embodiment, the semiconductor nanocrystal may have a relatively narrow-width spectrum to realize enhanced color purity or color reproducibility of a display. In one embodiment, for example, the semiconductor nanocrystal may have a full width at half maximum ("FWHM") of less than or equal to about 45 nm, for example, less than or equal to about 40 nm, or less than or equal to about 30 nm, in a light emitting wavelength spectrum.

In an embodiment, the semiconductor nanocrystal may have a particle diameter (the longest diameter in case of a non-spherical particle) ranging from about 1 nm to about 100 nm. For example, the semiconductor nanocrystal may have a particle diameter (the longest diameter in case of a non-spherical particle) ranging from about 1 nm to about 20 nm.

In one embodiment, for example, the color filter such as a first, a second or a third color filter and the like, may be a semiconductor nanocrystal-polymer composite including quantum rods aligned in a longitudinal direction as a semiconductor nanocrystal. As used herein, the term "quantum rod" refers to a semiconductor nanocrystal having an aspect ratio (e.g., a ratio of the major axis to the minor axis) of greater than or equal to about 1, for example, greater than or equal to about 2, greater than or equal to about 3, or greater than or equal to about 5. The aspect ratio of the quantum rods may be less than or equal to about 50, for example, less than or equal to about 30, or less than or equal to about 20. The quantum rods may have features, e.g., material or structure, substantially similar to those of the semiconductor nanocrystal described above. Unlike the spherical semiconductor nanocrystals, the quantum rod may emit linearly polarized light. The quantum rod may have a core-shell structure. The core of the quantum rod may have a shape of a sphere, an elliptical ball, a polyhedron, a rod, or the like, but is not limited thereto. The shell of the quantum rod may be an elongated-shaped semiconductor nanocrystal. The quantum rod may be manufactured by any known or commercially available method. The detailed description of the quantum rod may be referred to in WO2012/035535 (PCT/IL2011/000734), J. Phys. Chem. Lett. (2013) 4, 502-507, and Nano Today (2013) 8, 494-513, but is not limited thereto. The contents of the above references are incorporated herein in their entirety by reference.

The longitudinal axis of the plurality of the quantum rods is aligned in a predetermined direction in the color filter to emit polarized light. In an embodiment, where the optical device 300 is a polarizer, the quantum rods may be aligned substantially in the same direction as the transmission axis of the polarizer. In such an embodiment, the aligned quantum rods emit the polarized light, such that the color filter emits the polarized light.

In an embodiment, the aligning the quantum rods in a predetermined or desirable direction may be performed by applying a voltage, using an alignment layer, using a self-assembled monomolecule, or using a reactive mesogen, but is not limited thereto. In one embodiment, for example, the alignment layer including a polymer having a main chain and a side chain or other additional materials, such as a photolyzing material, a photoisomerizing material, a photocurable material and the like, is provided, and the surface of the alignment layer is treated to align the side chain in a predetermined direction, e.g., a predetermined single direction. A quantum rod-included polymer solution is coated on the surface-treated alignment layer to provide a film, and the obtained film may be selectively cured to provide a polymer composite (pattern) including a plurality of aligned quantum rods. The surface treatment on the alignment layer may be performed by rubbing, ultraviolet ("UV") light irradiating, or ion beam irradiating, but is not limited thereto.

In an embodiment, where the alignment of the aligned quantum rods is provided using the self-assembled monomolecule, a self-assembled monolayer is provided on the surface of the upper substrate using an appropriate method. The self-assembled monomolecules, which may effectively react and bond with a certain material, are aligned on the film in a predetermined direction. The quantum rod-polymer solution is coated on the self-assembled monomolecule layer to provide a quantum rod-included polymer composite layer, such that the quantum rod included in the layer may be aligned in the predetermined direction.

According to an alternative embodiment of a method of aligning the quantum rods in a predetermined direction, the reactive mesogen-included material is mixed with a quantum rod-polymer solution and coated on the upper substrate (e.g., according to inkjet printing, screen printing, spin coating, or bar coating) to provide a film, then the obtained film is irradiated with UV light to longitudinally align the quantum rods included in the film in a desirable direction.

In another alternative embodiment, the color filter may include an array composite including a plurality of isotropic semiconductor nanocrystals (e.g., quantum dots) and a plurality of longitudinally aligned metal nanowires. Herein, the term "longitudinally aligned metal nanowires" may mean aligned metal nanowires, longitudinal axes of which are aligned substantially parallel to each other. In such an embodiment, the semiconductor nanocrystals may be substantially the same as the quantum dots described above. In such an embodiment, the quantum dot may emit non-polarized light. When the non-polarized light emitted from the quantum dot arrives at the metal nanowire array, a component of light that is vertical to the alignment direction of the nanowire may be transmitted through the nanowire array, and the other component of light that is parallel to the alignment direction of the nanowire may be blocked by the nanowire array. In such an embodiment, the metal nanowire array acts as a forward scatterer, and the light passed through the metal nanowire may be the vertically polarized light to the aligned array. Accordingly, the color filter including the quantum dot-nanowire array composite may emit polarized light in a predetermined direction (e.g., a direction perpendicular to the aligned direction of the metal nanowire). In the array of the metal nanowires, the distance between the adjacent metal nanowires (hereinafter referred to as "pitch") may be less than or equal to about 62% of maximum peak wavelength of light emitted from the quantum dots, for example, less than or equal to about 61%, less than or equal to about 54%, less than or equal to about 50%, less than or equal to about 47%, or less than or equal to about 40% of the maximum peak wavelength of light emitted from the quantum dots. In such an embodiment, where the array has a pitch less than or equal to about 62% of the maximum peak wavelength of light emitted from the quantum dots, light emitted from the light emitting particles may be effectively linear-polarized.

In an embodiment, the metal nanowire may be a magnetic nanowire. In such an embodiment, the metal nanowires may be aligned using a magnetic field, such that an array of nanowires may be effectively aligned in a predetermined direction, e.g., a vertical direction a direction of the magnetic field. The magnetic field applied from the outside may magnetize nanowires to be rotated and displaced along the applied magnetic field direction. In such an embodiment, the aligned nanowire array may be effectively provided by adjusting the length of nano-segments and the strength of the magnetic field.

In another alternative embodiment, the metal nanowire may include a metal capable of showing a surface plasmon coupling. The metal capable of showing the surface plasmon coupling may include gold, silver, copper, platinum, nickel or a combination thereof, for example.

In one embodiment, for example, the nanowire may have a single composition. The nanowire having a single composition may include nickel, gold, silver, copper, platinum or a combination thereof (e.g., an alloy thereof). In another embodiment, the nanowire may be a multi-segmented nanowire. Herein, the term "multi segmented nanowire" refers to a nanowire including at least two segments, in which at least one segment includes a different material from the other segment.

In one embodiment, for example, the nanowire may be a multi-segmented magnetic nanowire. The multi-segmented magnetic nanowire may include a first segment having magnetism and a second segment capable of showing a surface plasmon coupling. The nanowire may be synthesized according to a known method. In one embodiment, for example, the nanowire may be commercially available or may be fabricated by electro-depositing a substrate with a nano-porous template. The nano-porous template may be commercially available, and the specific conditions of electro-deposition (kind of plating solution, and temperature) and the recovering method thereof have been known in the art.

In an embodiment, the metal nanowire may have a diameter of less than or equal to about 300 nm and an aspect ratio of greater than or equal to about 10. The metal nanowires may have an average diameter of less than or equal to about 300 nm, for example, less than or equal to about 280 nm, less than or equal to about 260 nm, less than or equal to about 200 nm, less than or equal to about 150 nm, or less than or equal to about 100 nm. The average diameter of metal nanowires may be greater than or equal to about 2 nm, for example, greater than or equal to about 5 nm or greater than or equal to about 10 nm, but is not limited thereto. The metal nanowires may have an average aspect ratio of greater than or equal to about 10, for example, greater than or equal to about 11, greater than or equal to about 12, greater than or equal to about 20, or greater than or equal to about 30.

The array of the metal nanowires may be arranged in a single layer (i.e., a monolayer). Alternatively, the metal nanowire array may include at least two layers.

Figure 2:
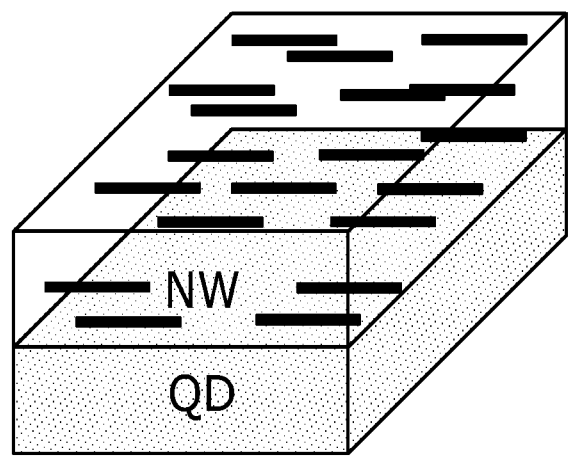
FIG. 2 is a schematic view showing an embodiment of a composite structure of an isotropic semiconductor nanocrystal and a nanowire, according to the invention.

In one embodiment, for example, the semiconductor nanocrystal-nanowire array composite may include a first layer, and a second layer in contact with a surface (e.g., an upper surface) of the first layer (see FIG. 2). The first layer includes a first host matrix and an array of the metal nanowires dispersed in the first host matrix, and the second layer includes a second host matrix and the light emitting material dispersed in the second host matrix. The first host matrix material and the second host matrix material may be the same as or different from each other. The first host matrix and the second host matrix may include or be made of a transparent polymer. The transparent polymer may be a dielectric (e.g., insulating) polymer. In one embodiment, for example, the transparent polymer may include polyvinylpyrrolidone ("PVP"), polystyrene, polyethylene, a polyacrylic polymer, polypropylene, polymethylmethacrylate ("PMMA"), polybutylmethacrylate ("PBMA"), a copolymer thereof, or a combination thereof, but not being limited thereto. The thickness of the first layer and the second layer may be appropriately selected, but is not particularly limited. The thickness of first layer and second layer may have predetermined thicknesses, respectively, to allow the coupling of at least a part of light emitted from the light emitting material with the surface plasmon of the magnetic nanowire to be effectively performed. In an embodiment, the material of the host matrix may be selected to not quench the light emission of the light emitting material (quantum dots). In an embodiment, the host matrix material may have an appropriate level of viscosity to effectively prevent nanowires from being drawn toward the side of the film during the drying. In one embodiment, for example, the host matrix, such as PVP, has sufficient viscosity to control the position of the nanowires, to provide a high polarization degree. In such an embodiment, after drying once, the host matrix may maintain the alignment of the nanowires as aligned, to provide a three-dimensional structure in which nanowires are highly aligned according to one dimension.

Figure 3:
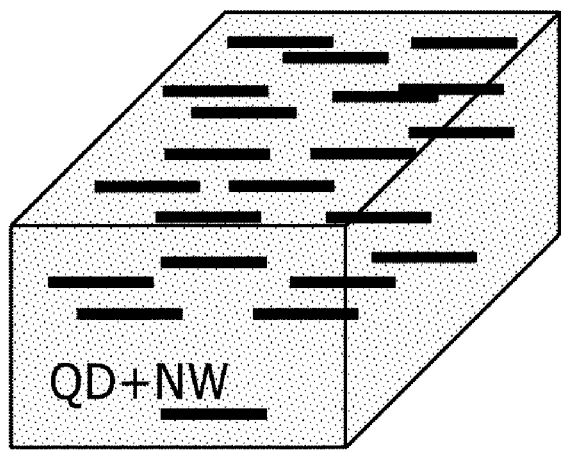
FIG. 3 is a schematic view showing an alternative embodiment of a composite structure of an isotropic semiconductor nanocrystal and a nanowire, according to the invention.

In another alternative embodiment, the semiconductor nanocrystal-nanowire array composite may include a single layer including an array of the metal nanowires and the light emitting material in a single host matrix (see FIG. 3). In such an embodiment, the host matrix is substantially the same as the first and second host matrices described above. In one embodiment, for example, the host matrix may be a transparent polymer. In one embodiment, for example, the transparent polymer may include PVP, polystyrene, polyethylene, a polyacrylic polymer, polypropylene, PMMA, PBMA, a copolymer thereof, or a combination thereof, but not being limited thereto.

In an embodiment, the array composite including a semiconductor nanocrystal-(aligned) metal nanowire may be fabricated by a method described above.

In such an embodiment, a water dispersion including multi-segmented nanowires such as gold (3 μm)-nickel (7 μm)-gold (3 μm) is mixed with a PVP solution (solvent: water), and drop-casted on a glass substrate and dried under a magnetic field at room temperature for one night to provide a nanowire film in which nanowire arrays are dispersed. A PVP solution including CdTe quantum dots is drop-casted on the nanowire film and dried at room temperature for one night.

In such an embodiment, a degree of polarization (P) of the obtained quantum dot-nanowire array composite film is calculated as follows.

Light emitted from a 375 nm laser is irradiated to the quantum dot-nanowire array composite film, and light emitted from the optical device is transmitted through a linear polarizer, a monochromator, and a photomultiplier tube and analyzed by a photomultiplier tube ("PMT") photodetector. For light emitted from the quantum dot-nanowire array composite film, S polarized light (component perpendicular to the alignment direction of nanowires) and P polarized light (component parallel to the alignment direction of nanowires) according to the wavelength are measured, and the degree of polarization is calculated according to the following Formula 1.

$$P=(s \text{ polarized light}-p \text{ polarized light})/(s \text{ polarized light}+p \text{ polarized light}) \qquad \text{[Formula 1]}$$

Figure 4:
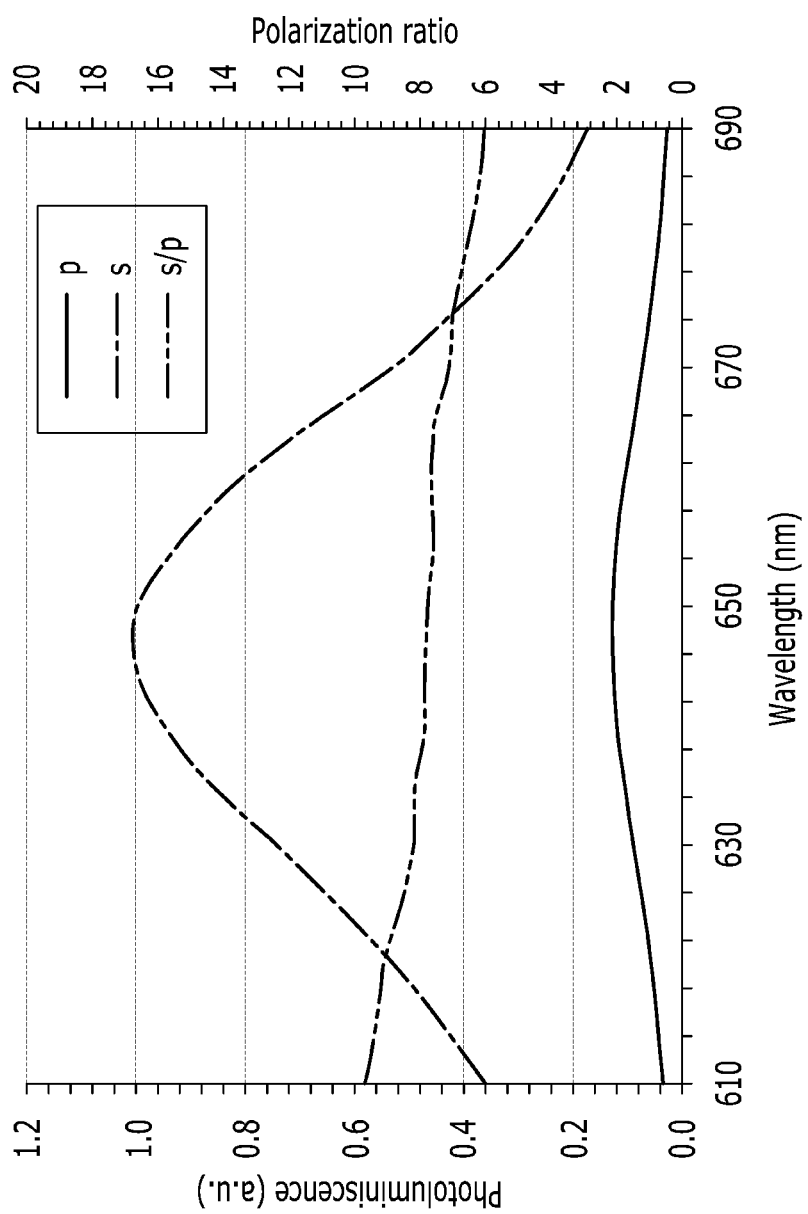
FIG. 4 shows polarization characteristics of an embodiment of a composite of an isotropic semiconductor nanocrystal and a nanowire, according to the invention.

FIG. 4 shows polarization characteristics of an embodiment of a composite of an isotropic semiconductor nanocrystal and a nanowire, according to the invention. As shown in FIG. 4, it is confirmed that the obtained quantum dot-nanowire array composite film may emit polarized light (e.g., having a peak wavelength of about 645 nm) having an s/p ratio of about 10. When the thickness of the film including a nanowire array is increased, polarized light having an s/p ratio of about 15 may also be obtained.

In another alternative embodiment, the color filter may include a plurality of aligned quantum plates. The quantum plate refers to a plate-shaped semiconductor nanocrystal or a sheet-shaped quantum dot, and the manufacturing method and the alignment method thereof are known in the art (see, CrystEngComm, 2010, 12, 3467-3470).

In an embodiment, the third color filter (B) may be a transparent color filter which does not change the light emitting spectrum of the light source. In such an embodiment, blue light emitted from the backlight unit enters in a polarized state through a polarizing plate and a liquid crystal layer and is emitted as it is. In an alternative embodiment, the third color filter may further include a plurality of aligned quantum rods. In an alternative embodiment, the third color filter may further include a scatterer capable of maintaining the polarization of incident light.

The photoluminescent LCD may further include a blue light blocking layer (or blue filter BF). The blue light blocking layer may be disposed between the bottom surface of the first color filter (R) and the second color filter (G) and the upper substrate 300 (see FIG. 5). Alternatively, the blue light blocking layer BF may be disposed on the optical device 300. In an embodiment, as shown from FIG. 6, the blue light blocking layer BF may be a sheet having an opening on a region corresponding to a pixel area (third color filter) expressing blue. In such an embodiment, the blue light blocking layer BF may be disposed on a region corresponding to the first and second color filters. In one embodiment, for example, the blue light blocking layer BF may be formed by alternatively stacking at least two layers having different refractive indexes, and the blue light blocking layer BF transmits wavelengths excepting the blue wavelength band and blocks the blue wavelength band. The blocked light of blue wavelength may be reflected to be recycled. The blue light blocking layer BF may block light emitted from the blue light source of the backlight unit 400 from being directly emitted to the outside.

An embodiment of the LCD having the structure described above may have improved luminance (e.g., about 2 to 3 times higher than the luminance of the display device using a conventional white light source) and improved display quality by using a semiconductor nanocrystal-polymer composite pattern capable of changing the color of light from a light source, having high light emitting efficiency, and emitting polarized light as a color filter.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A layered structure comprising:
   a substrate having a first surface and a second surface opposite to the first surface; and
   a photoluminescent color filter layer disposed on the first surface of the substrate;
   wherein the photoluminescent color filter layer comprises:
      a first color filter comprising a first semiconductor nanocrystal-polymer composite, which comprises a first array composite and is configured to emit a polarized first light based on incident light, wherein the first array composite comprises a transparent polymer host matrix, a plurality of first isotropic semiconductor nanocrystals emitting a first non-polarized light having a peak wavelength of in a range of greater than 590 nanometers and less than 700 nm and a plurality of aligned metal nanowires, whereby the first non-polarized light passes through and is polarized by the aligned metal nanowires to provide the first polarized light, and the first polarized light is extracted from the second surface, wherein the plurality of first isotropic semiconductor nanocrystals and the plurality of aligned metal nanowires are dispersed in the transparent polymer host matrix, and
      a second color filter comprising a second semiconductor nanocrystal-polymer composite, which comprises a second array composite and is configured to emit a polarized second light based on incident light, wherein the second array composite comprises a transparent polymer host matrix, a plurality of second isotropic semiconductor nanocrystals emitting a second non-polarized light having a peak wavelength of in a range of greater than or equal to 510 nm and less than or equal to 570 nm and a plurality of aligned metal nanowires, whereby the second non-polarized light passes through and is polarized by the plurality of aligned metal nanowires to provide the second polarized light, and the second polarized light is extracted from the second surface, wherein the plurality of second isotropic semiconductor nanocrystals and the plurality of aligned metal nanowires are dispersed in the transparent polymer host matrix,
   wherein the transparent polymer host matrix of each of the first or second array composite comprises polyvinylpyrrolidone, polystyrene, polyethylene, a polyacrylic polymer, polypropylene, polymethylmethacrylate, polybutylmethacrylate, a copolymer thereof, or a combination thereof,
   wherein the plurality of aligned metal nanowires of each of the first or second array composite comprises a first metal and a second metal different from the first metal, and
   wherein the first metal comprises gold, silver, copper, platinum, nickel or a combination thereof, and the second metal comprises gold, silver, copper, platinum, nickel or a combination thereof.

2. The layered structure of claim 1, wherein the polarized first light is a polarized red light, and the polarized second light is a polarized green light.

3. The layered structure of claim 1, further comprising:
   an optical feature disposed on the second surface of the substrate or under the layered structure.

4. The layered structure of claim 3, wherein
   the optical feature maintains polarization of light emitted from the photoluminescent color filter layer, and
   the optical feature comprises a polarizer or a refractive index-controlling coating having no polarization function.

5. The layered structure of claim 1, wherein the plurality of aligned metal nanowires of each of the first or second array comprise a metal capable of showing a surface plasmon coupling and the metal capable of showing the surface plasmon coupling comprises gold, silver, copper, platinum, nickel or a combination thereof.

6. The layered structure of claim 1, wherein the plurality of aligned metal nanowires of each of the first or second array have an average diameter in a range of 100 nm to 300 nm.

7. The layered structure of claim 1, wherein the plurality of aligned metal nanowires of each of the first or second array have an aspect ratio of greater than or equal to 10.

8. The layered structure of claim 1, wherein either of the first or second array composites has a monolayer structure comprising an array of the aligned metal nanowires and the isotropic semiconductor nanocrystals disposed in a host matrix.

9. The layered structure of claim 1, wherein the photoluminescent color filter layer comprises a third color filter which emits a polarized third light based on incident light and the third color filter comprises a transparent color filter which does not change a light spectrum of the incident light.

10. The layered structure of claim 9, wherein the third color filter further comprises a scatterer which maintains polarization of the incident light.

11. The layered structure of claim 1, further comprising:
    a blue light blocking layer disposed on the first color filter and the second color filter.

12. The layered structure of claim 1, wherein a semiconductor nanocrystal of either of the first or second semiconductor nanocrystal-polymer composites has a core-shell structure.

13. The layered structure of claim 1, wherein a semiconductor nanocrystal of each of the first or second semiconductor nanocrystal-polymer composite comprises a Group II-VI compound, a Group III-V compound, a Group IV-VI compound, a Group IV compound, or a combination thereof.

14. The layered structure of claim 1, wherein the metal nanowires comprise a multi-segmented magnetic nanowire comprising a first segment comprising the first metal and a second segment adjacent to the first segment and comprising the second metal.

15. A display device, comprising the layered structure of claim 1.

\* \* \* \* \*